United States Patent [19]

Mizunoya et al.

[11] Patent Number: 4,704,320

[45] Date of Patent: Nov. 3, 1987

[54] SUBSTRATE STRUCTURE

[75] Inventors: Nobuyuki Mizunoya; Yasuyuki Sugiura; Masakazu Hatori, all of Yokohama, Japan

[73] Assignee: Kabushiki Kaisha Toshiba, Kawasaki, Japan

[21] Appl. No.: 824,874

[22] Filed: Jan. 31, 1986

[30] Foreign Application Priority Data

Jan. 31, 1985 [JP] Japan ................................. 60-15324

[51] Int. Cl.$^4$ ...................... B32B 7/00; H01L 23/48; H05K 1/00
[52] U.S. Cl. .................................. 428/210; 428/901; 174/68.5; 357/68
[58] Field of Search ...................... 428/209, 210, 901; 357/68, 70; 174/68.5

[56] References Cited

U.S. PATENT DOCUMENTS

| 3,939,559 | 2/1976 | Fendley et al. | 29/628 |
| 3,994,430 | 11/1976 | Cusano et al. | 228/122 |
| 4,110,904 | 9/1978 | Johnson | 29/628 |
| 4,172,547 | 10/1979 | DelGrande | 228/121 |
| 4,323,293 | 4/1982 | DeRoven et al. | 339/17 CF |
| 4,521,476 | 6/1985 | Asai et al. | 428/209 |
| 4,578,304 | 3/1986 | Hamaguchi | 428/209 |

Primary Examiner—John E. Kittle
Assistant Examiner—Patrick J. Ryan
Attorney, Agent, or Firm—Finnegan, Henderson, Farabow, Garrett & Dunner

[57] ABSTRACT

This invention resides in a substrate structure comprising a ceramic tile, a conductor layer of copper or copper alloy directly joined to the surface of the ceramic tile, and an outgoing terminal connected to the conductor layer, which substrate structure is characterized by the fact that the part of the conductor layer to which the aforementioned outgoing terminal is joined is raised from the ceramic tile so as to bridge an empty space.

5 Claims, 4 Drawing Figures

SUBSTRATE STRUCTURE2

The present application claims priority of Japanese Patent Application Ser No. 85/15324 filed on Jan. 31, 1985.

FIELD OF THE INVENTION

This invention relates to a substrate structure to be used as in a semiconductor device.

TECHNICAL BACKGROUND OF THE INVENTION AND RELATED ART STATEMENT

In recent years, efforts are being made to realize commercialization of a substrate comprising a ceramic tile and a conductor layer of copper or copper alloy directly joined to the ceramic tile. Since this substrate has nothing to intervene between the conductor layer and the ceramic tile, it permits quick diffusion of the heat generated by a semiconductor element deposited on the conductor layer, encouraging efforts to develop a semiconductor of increased capacity to be used on the substrate.

The substrate of the type described above, however, poses the following problem and has room for further improvement. Specifically, this substrate has the possibility of entailing the phenomenon that, while the semiconductor element is operating, the ceramic tile sustains cracks near the terminal connected to the conductor layer.

OBJECT OF THE INVENTION

This invention is aimed at providing a substrate structure which is incapable of sustaining cracks in the ceramic tile during the operation of the semiconductor element and, therefore, capable of providing highly reliable performance.

SUMMARY OF THE INVENTION

This invention resides in a substrate structure comprising a ceramic tile, a conductor layer of copper or copper alloy directly joined to the surface of the ceramic tile, and an outgoing terminal connected to the conductor layer, which substrate structure is characterized by the fact that the part of the conductor layer to which the aforementioned outgoing terminal is joined is raised from the ceramic tile so as to bridge an empty space.

DETAILED DESCRIPTION OF THE INVENTION

The inventor has perfected this invention as a result of his diligent study devoted to elucidation of the phonomenon of occurrence of cracks in the ceramic tile. To be specific, the difference of thermal expansion between ceramics and copper is in the range of 100 to $140 \times 10^{-7}/°C.$, so large that in a substrate having a copper conductor directly joined to a ceramic tile, thermal stress due to the aforementioned difference is generated in the interface between the two substances, and this stress, on surpassing the strength of ceramic, causes breakage of the ceramic tile. In a substrate having a copper conductor directly joined to a ceramic tile, it is customary to produce the substrate in a state free from immoderate stress by selection of the proportions of thickness of the ceramic tile and the copper conductor. When the substrate has a semiconductor element mounted thereon, since the outgoing terminal is joined to the copper conductor part of the substrate, the stress generated at the point of this joint locally increases. It is, therefore, suspected that when the semiconductor in this state is set to operation and consequently exposed to cycles of temperature fluctuation, excessive stress will be exerted on the ceramic tile and eventually cause breakage of the ceramic tile.

Figure 1:
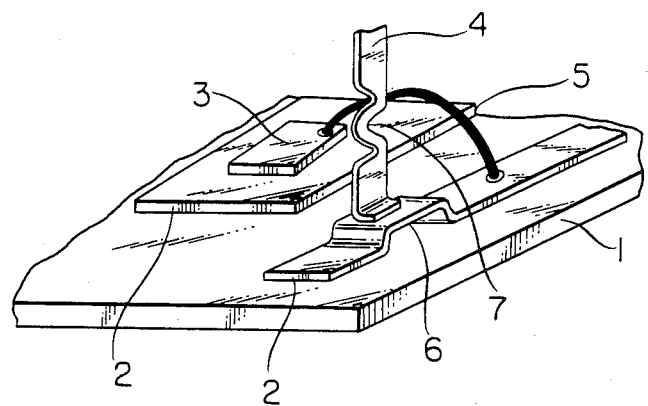
FIG. 1 is a magnified perspective view of a typical substrate structure embodying the present invention, and (1)

The inventor, by devising a structure for the part of the copper conductor to which the outgoing terminal is joined, has succeeded in mitigating the thermal stress generated in the part mentioned above. One embodiment is illustrated in FIG. 1. FIG. 1 is a magnified perspective view illustrating part of a typical substrate structure of this invention. As illustrated in FIG. 1, a conductor layer 2 made of copper is directly joined to the surface of a ceramic tile 1 and a semiconductor element 3 and an outgoing terminal 4 are joined to the upper side of the conductor layer. The pole of the semiconductor element 3 and the outgoing terminal 4 are connected to each other with a thin metallic wire 5. The part of the conductor 2 to which the outgoing terminal is joined is raised from the ceramic tile 1 so as to bridge an empty space 6.

The substrate structure illustrated in FIG. 1 is generally set in place in a resinous case, which is then filled up to capacity with silicone resin gel and subsequently sealed with a thermosetting resin such as epoxy resin.

In the substrate structure shown in FIG. 1, the thermal stress generated in the outgoing terminal is not directly inflicted on the ceramic tile because the part of the conductor layer to which the outgoing terminal is joined is not directly connected to the ceramic tile. For this effect to be sufficient, it is desirable that the bridging portion should be wider than the joint between the outgoing terminal and the conductor layer. The displacement due to the thermal stress of the outgoing terminal can be effectively absorbed by forming the aforementioned joint on the part of the conductor layer in the shape of a bridge supported at two or more points. If the joint on the part of the conductor layer is formed in the shape of a cantilever, the formation of the empty space is not attained easily during the direct connection of the conductor layer, and the displacement due to the thermal stress of the outgoing terminal at times cannot be sufficiently absorbed. In the part of the outgoing terminal 4 close to the joint, a notch 7 of the shape illustrated in FIG. 1 is cut in order that the outgoing terminal may alleviate and absorb the thermal stress. As the result, this effect of the notch coupled with the effect of absorption brought about by the bridging portion of the conductor layer notably reduces the effect of thermal stress exerted on the ceramic tile.

The effect of the empty space 6 is conspicuous so long as the gap of the empty space 6 is at least 0.1 mm. For practical purpose, the gap is desired not to exceed 0.5 mm. As means of forming the empty space, the technique of bending by the use of a press or the technique of removal by the use of a cutting machine if applicable. The technique of bending enables the formation of the empty space to be effected with ease and the technique of removal enables the conductor layer to acquire one flat surface.

Figure 2:
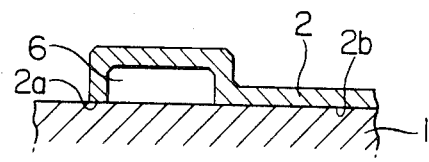
FIG. 2 through FIG. 4 are cross sectional views for showing the main portions of modified embodiments according to the present invention, respectively.

(2) According to the technique of bending, the conductor layer 2 may be formed in the shape as illustrated in FIG. 2, through press-molding. In the modified embodiment of FIG. 2, the empty space 6 is formed between the conductor layer 2 and the ceramic tile 1, however, one end 2a of the conductor layer 2 faces the ceramic tile 1 without extending over the surface of the conductor layer 2, while the outer end 2b is extending over that surface. Both ends 2a and 2b of the conductor layer 2 are joined to the ceramic tile 1 in the same manner as those in FIG. 1.

Figure 3:
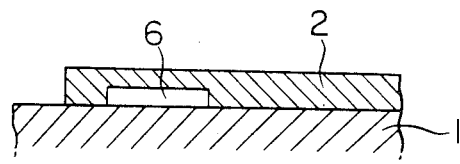
Figure 4:
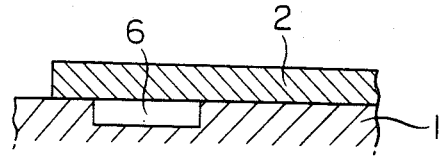

Through the technique of removal by the use of a cutting machine, the conductor layer 2 of copper may have a concavity formed as illustrated in another modified embodiment of FIG. 3. In still another modified embodiment of FIG. 4, a concavity may be formed in the ceramic tile 1 by the use of an impressing machine or cutting machine. The formation of the concavity in the ceramic tile 1 must be carried out before sintering of the tile, when it is effected with an impressing machine. On the other hand, the formation of the concavity may be effected with a cutting machine either before or after the sintering. As shown in FIGS. 3 and 4, it should be appreciated that in each embodiment, the conductor layer 2 is joined to the ceramic tile 1 so that the concavity constitutes the empty space 6 no matter which has the concavity, the conductor layer or the ceramic tile.

The composite of this invention which has a ceramic part and a copper or copper alloy part directly joined to each other can be obtained by the following procedure. A copper sheet, for example, is superposed directly on one surface of a ceramic sheet and heated at a temperature not exceeding 1,083° C. (melting point of copper) and exceeding 1,063° C. (eutectic point of copper-copper oxide) in the atmosphere of an inert gas such as nitrogen, for example. Desirably, the copper sheet to be used in this case contains 100 to 2,000 ppm of oxygen. For example, tough pitch electrolytic copper can be advantageously used. This oxygen, on being heated, serves the purpose of inducing formation of an eutectic copper-copper oxide mixture which contributes to the union of the ceramic part and the copper part.

As a ceramic material excelling in electrical properties, aluminum oxide can be adopted. As a ceramic material excelling in thermoelectric conductivity, aluminum nitride, beryllium oxide, or silicon carbide can be desirably used. As a ceramic material excelling in electrical properties, aluminum nitride can be used desirably. The thickness of the ceramic tile is in the range of 0.4 to 1.0 mm and that of the copper conductor in the range of 0.2 to 0.5 mm.

EXAMPLE OF THE INVENTION

A ceramic tile of the aluminum nitride (0.6 mm in thickness) and a conductor layer of tough pitch copper (0.3 mm in thickness) having an empty space formed therein by press molding are directly joined in a structure illustrated in FIG. 1. Further, an outgoing terminal of copper was welded with soft solder to the conductor layer as illustrated in FIG. 1. For comparison, a structure was obtained by following the procedure just described, above except that the conductor layer was devoid of the empty space.

These structures were tested by thermal shock for occurrence of cracks in the ceramic tiles. The thermal shock test consisted in exposing the samples to repeating cycles of cooling to $-50°$ C. and heating to $+150°$ C. The sample of this invention, even after 200 cycles of the temperature fluctuation, showed no discernible crack, whereas the comparative sample was found to sustain a discernible crack in the part of the ceramic tile near the base of the outgoing terminal after 100 cycles of the temperature fluctuation.

In accordance with this invention, the substrate structure obtained thereby enjoys high reliability because the ceramic tile thereof does not sustain cracks in spite of the thermal cycles generated by the operation of the semiconductor element.

We claim:

1. A substrate structure comprising a ceramic tile, a conductor layer of copper or copper alloy, an outgoing terminal connected to and extending from a first surface of said conductor layer, a second surface of said conductor layer opposed to said first surface and directly joined to a surface of said ceramic tile and a gap between a surface portion of said second surface and said ceramic tile surface, whereby thermal stresses between said conductor layer and said ceramic tile are alleviated.

2. A substrate structure according to claim 1, wherein said outgoing terminal has a notch in a portion thereof extending from said first surface of said conductor layer.

3. A substrate structure according to claim 1 or claim 2, wherein said ceramic tile is made of a compound selected from the group consisting of aluminum oxide, aluminum nitride, beryllium oxide, and silicon carbide.

4. A substrate structure according to claim 1, wherein said gap is formed in said conductor layer with said gap having opposed open ends.

5. A substrate structure according to claim 1, wherein said gap extends from 0.1 to 0.5 mm from said ceramic tile surface to said surface portion of said second surface.

* * * * *